US008692287B2

(12) United States Patent
Shioda et al.

(10) Patent No.: US 8,692,287 B2
(45) Date of Patent: Apr. 8, 2014

(54) NITRIDE SEMICONDUCTOR DEVICE, NITRIDE SEMICONDUCTOR WAFER, AND METHOD FOR MANUFACTURING NITRIDE SEMICONDUCTOR LAYER

(75) Inventors: Tomonari Shioda, Kanagawa-ken (JP); Hung Hung, Kanagawa-ken (JP); Jongil Hwang, Kanagawa-ken (JP); Taisuke Sato, Kanagawa-ken (JP); Naoharu Sugiyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 13/222,200

(22) Filed: Aug. 31, 2011

(65) Prior Publication Data

US 2012/0292593 A1    Nov. 22, 2012

(30) Foreign Application Priority Data

May 16, 2011    (JP) .................. 2011-109560

(51) Int. Cl.
*H01L 33/00* (2010.01)
(52) U.S. Cl.
USPC ............. 257/101; 438/29; 257/E33.008
(58) Field of Classification Search
USPC ............. 257/79–103, E33.008–E33.009, 257/E33.025, E33.028, E33.012; 438/29–47
See application file for complete search history.

(56) References Cited

U.S. PATENT DOCUMENTS

| 7,612,363 B2 * | 11/2009 | Takeda et al. | 257/14 |
| 7,982,210 B2 * | 7/2011 | Kim | 257/14 |

FOREIGN PATENT DOCUMENTS

| JP | 2000-68594 A | 3/2000 |
| JP | 2000-156348 A | 6/2000 |
| JP | 2001-313421 A | 11/2001 |
| JP | 2003-78169 A | 3/2003 |
| JP | 2004-47764 | 2/2004 |
| JP | 2005-57308 A | 3/2005 |
| JP | 2008-526014 A | 7/2008 |
| JP | 4301592 | 5/2009 |
| JP | 2010-509081 A | 3/2010 |
| WO | WO 2010/021457 A2 | 2/2010 |

OTHER PUBLICATIONS

Kang Jea Lee, et al., "Reduction of dislocations in GaN epilayers grown on Si(111) substrate using $Si_xN_y$ inserting layer", Applied Physics Letters, vol. 85, No. 9, Aug. 30, 2004, pp. 1502-1504.
Korean Office Action Issued Dec. 13, 2012 in Patent Application No. 10-2012-0008745 (with English translation).

(Continued)

*Primary Examiner* — Julio Maldonado
*Assistant Examiner* — Sonya D McCall Shepard
(74) *Attorney, Agent, or Firm* — Oblon, Spivak, McClelland, Maier & Neustadt, L.L.P.

(57) ABSTRACT

According to one embodiment, a nitride semiconductor device includes: a stacked foundation layer, and a functional layer. The stacked foundation layer is formed on an AlN buffer layer formed on a silicon substrate. The stacked foundation layer includes AlN foundation layers and GaN foundation layers being alternately stacked. The functional layer includes a low-concentration part, and a high-concentration part provided on the low-concentration part. A substrate-side GaN foundation layer closest to the silicon substrate among the plurality of GaN foundation layers includes first and second portions, and a third portion provided between the first and second portions. The third portion has a Si concentration not less than $5 \times 10^{18}$ cm$^{-3}$ and has a thickness smaller than a sum of those of the first and second portions.

29 Claims, 14 Drawing Sheets

(56) References Cited

OTHER PUBLICATIONS

Japanese Office Action issued Feb. 15, 2012, in Patent Application No. 2011-109560 (with English-language translation).

U.S. Appl. No. 13/407,169, filed Feb. 28, 2012, Shioda, et al.
U.S. Appl. No. 13/868,275, filed Apr. 23, 2013, Harada, et al.
Japanese Office Action issued Apr. 23, 2013 in Patent Application No. 2012-092772 with English Translation.

* cited by examiner

500µm

500µm

500µm

500µm

250μm

250μm

NITRIDE SEMICONDUCTOR DEVICE, NITRIDE SEMICONDUCTOR WAFER, AND METHOD FOR MANUFACTURING NITRIDE SEMICONDUCTOR LAYER

CROSS-REFERENCE TO RELATED APPLICATIONS

This application is based upon and claims the benefit of priority from the prior Japanese Patent Application No. 2011-109560, filed on May 16, 2011; the entire contents of which are incorporated herein by reference.

FIELD

Embodiments described herein relate generally to a nitride semiconductor device, a nitride semiconductor wafer, and a method for manufacturing a nitride semiconductor layer.

BACKGROUND

Light emitting diodes (LED), which are semiconductor light emitting devices using nitride semiconductors, have been used for display devices, illumination and the like. Electronic devices using the nitride semiconductors have been used for high-frequency devices and high-power devices.

When such nitride semiconductor device is formed on a silicon (Si) substrate having an excellent mass productivity, a defect and a crack are easily generated due to a difference in lattice constant or thermal expansion coefficient. There is a demand for a technique of producing a high-quality crystal on the silicon substrate. Especially when it is attempted to form a thick n-type GaN layer on the silicon substrate, a crack tends to be generated.

DETAILED DESCRIPTION

Figure 1:
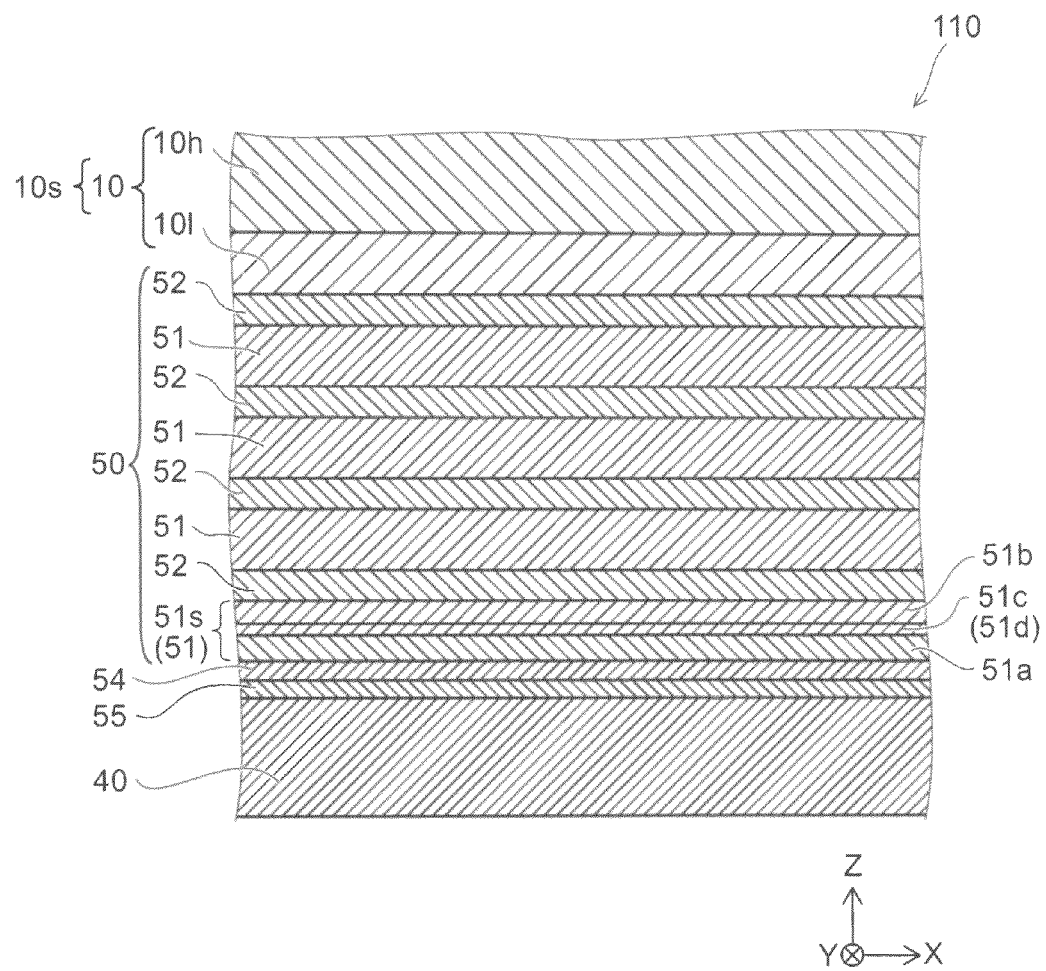
FIG. 1 is a schematic sectional view showing a nitride semiconductor device according to a first embodiment.

In general, according to one embodiment, a nitride semiconductor device includes: a stacked foundation layer, and a functional layer. The stacked foundation layer is formed on an AlN buffer layer formed on a silicon substrate. The stacked foundation layer includes a plurality of AlN foundation layers and a plurality of GaN foundation layers being alternately stacked with the AlN foundation layers. The functional layer includes a low-concentration part, and a high-concentration part. The low-concentration part is provided on the stacked foundation layer. The low-concentration part includes a nitride semiconductor and has a Si concentration less than $1 \times 10^{18}$ cm$^{-3}$. The high-concentration part is provided on the low-concentration part and has a Si concentration not less than $1 \times 10^{18}$ cm$^{-3}$. A substrate-side GaN foundation layer closest to the silicon substrate among the plurality of GaN foundation layers includes a first portion, a second portion, and a third portion. The first portion has a Si concentration less than $5 \times 10^{18}$ cm$^{-3}$. The second portion has a Si concentration less than $5 \times 10^{18}$ cm$^{-3}$. The third portion is provided between the first portion and the second portion. The third portion has a Si concentration not less than $5 \times 10^{18}$ cm$^{-3}$ and has a thickness smaller than a sum of a thickness of the first portion and a thickness of the second portion.

According to another embodiment, a nitride semiconductor device includes: a functional layer formed on an AlN buffer layer formed on a silicon substrate. The functional layer includes: a plurality of low-concentration parts, and a plurality of high-concentration parts. The plurality of low-concentration parts include a nitride semiconductor and have a Si concentration less than $5 \times 10^{18}$ cm$^{-3}$. The plurality of high-concentration parts have a Si concentration not less than $5 \times 10^{18}$ cm$^{-3}$. The low-concentration parts are alternately stacked with the high-concentration parts. A thickness of each of the high-concentration parts is smaller than a thickness of each of the low-concentration parts.

According to one embodiment, a nitride semiconductor wafer includes: a silicon substrate, an AlN buffer layer, a stacked foundation layer, and a functional layer. The AlN buffer layer is provided on the silicon substrate. The stacked foundation layer is provided on the AlN buffer layer. The stacked foundation layer includes a plurality of AlN foundation layers and a plurality of GaN foundation layers being alternately stacked with the AlN foundation layers. The functional layer includes a low-concentration part, and a high-concentration part. The low-concentration part is provided on the stacked foundation layer. The low-concentration part includes a nitride semiconductor and has a Si concentration less than $5 \times 10^{18}$ cm$^{-3}$. The high-concentration part is provided on the low-concentration part and has a Si concentration not less than $5 \times 10^{18}$ cm$^{-3}$. A substrate-side GaN foundation layer closest to the silicon substrate among the plurality of GaN foundation layers includes: a first portion, a second portion, and a third portion. The first portion has a Si concentration less than $5 \times 10^{18}$ cm$^{-3}$. The second portion has a Si concentration less than $5 \times 10^{18}$ cm$^{-3}$. The third portion is provided between the first portion and the second portion. The third portion has a Si concentration not less than $5\times10^{18}$ cm$^{-3}$ and has a thickness smaller than a sum of a thickness of the first portion and a thickness of the second portion.

According to another embodiment, a nitride semiconductor wafer includes: a silicon substrate, an AlN buffer layer, and a functional layer. The AlN buffer layer is provided on the silicon substrate. The functional layer is provided on the AlN buffer layer. The functional layer includes a plurality of low-concentration parts, and a plurality of high-concentration parts. The plurality of low-concentration parts include a nitride semiconductor and have a Si concentration less than $5\times10^{18}$ cm$^{-3}$. The plurality of high-concentration parts have a Si concentration not less than $5\times10^{18}$ cm$^{-3}$. The low-concentration parts are alternately stacked with the high-concentration parts. A thickness of each of the high-concentration parts is smaller than a thickness of each of the low-concentration parts.

According to another embodiment, a method for manufacturing a nitride semiconductor layer is disclosed. The method can form a stacked foundation layer by alternately stacking a plurality of AlN foundation layers and a plurality of GaN foundation layers on an AlN buffer layer provided on a silicon substrate. In addition, the method can form a functional layer by forming a low-concentration part on the stacked foundation layer and forming a high-concentration part on the low-concentration part. The low-concentration part includes a nitride semiconductor and has a Si concentration less than $5\times10^{18}$ cm$^{-3}$. The high-concentration part has a Si concentration not less than $5\times10^{18}$ cm$^{-3}$. In formation of a substrate-side GaN foundation layer closest to the silicon substrate among the plurality of GaN foundation layers, the forming the stacked foundation layer includes forming a first portion, a second low-concentration foundation, and a third portion. The first portion has a Si concentration less than $5\times10^{18}$ cm$^{-3}$. The second portion has a Si concentration less than $5\times10^{18}$ cm$^{-3}$. The third portion is provided between the first portion and the second portion. The third portion has a Si concentration not less than $5\times10^{18}$ cm$^{-3}$ and has a thickness smaller than a sum of a thickness of the first portion and a thickness of the second portion.

According another embodiment, a method for manufacturing a nitride semiconductor layer is disclosed. The method can form a functional layer on an AlN buffer layer formed on a silicon substrate. The forming the functional layer includes repeating a process a plurality of times. The process includes forming a low-concentration part and forming a high-concentration part. The low-concentration part includes a nitride semiconductor and has a Si concentration less than $5\times10^{18}$ cm$^{-3}$. The high-concentration part has a Si concentration not less than $5\times10^{18}$ cm$^{-3}$. A thickness of each of the high-concentration parts is smaller than a thickness of each of the low-concentration parts.

Exemplary embodiments of the invention will now be described in detail with reference to the drawings.

The drawings are schematic or conceptual; and the relationships between the thickness and width of portions, the proportions of sizes among portions, etc., are not necessarily the same as the actual values thereof. Further, the dimensions and proportions may be illustrated differently among the drawings, even for identical portions.

In the specification and the drawings of the application, components similar to those described in regard to a drawing thereinabove are marked with like reference numerals, and a detailed description is omitted as appropriate.

(First Embodiment)

The embodiment relates to a nitride semiconductor device. The nitride semiconductor device according to the embodiment includes semiconductor devices such as semiconductor light emitting devices, semiconductor light receiving devices and electronic devices. Examples of the semiconductor light emitting devices include light emitting diodes (LEDs) and laser diodes (LDs). Examples of the semiconductor light receiving devices include photodiodes (PDs). Examples of the electronic devices include high electron mobility transistors (HEMTs), heterojunction bipolar transistors (HBTs), field-effect transistors (FETs) and Schottky barrier diodes (SBDs).

FIG. 1 is a schematic sectional view illustrating configuration of a nitride semiconductor device according to the first embodiment.

As shown in FIG. 1, a nitride semiconductor device 110 according to the embodiment has a stacked foundation layer 50 and a functional layer 10s.

The stacked foundation layer 50 is formed on an AlN buffer layer 55 formed on a silicon substrate 40.

The thickness of the AlN buffer layer 55 is, for example, about 30 nanometers (nm). By using the AlN buffer layer 55 containing AlN that is hard to chemically react with the silicon substrate 40 serving as a layer in contact with the silicon substrate 40, it is easy to solve a problem such as meltback etching.

In the example, an intermediate layer 54 is provided between the stacked foundation layer 50 and the AlN buffer layer 55. For example, an AlGaN layer is used as the intermediate layer 54. For example, an $Al_{0.25}Ga_{0.75}N$ layer is used as the intermediate layer 54. The thickness of the intermediate layer 54 is, for example, about 40 nm. The intermediate layer 54 is provided as needed and may be omitted according to circumstances.

The stacked foundation layer 50 includes a plurality of AlN foundation layers 52 and a plurality of GaN foundation layers 51 alternately stacked with the AlN foundation layers 52.

The functional layer 10s is provided on the stacked foundation layer 50.

Here, a direction heading from the stacked foundation layer 50 toward the functional layer 10s is defined as a Z-axis direction. One axis perpendicular to the Z axis is defined as an X axis. A direction perpendicular to the Z axis and the X axis is defined as a Y axis. The functional layer 10s is stacked with the stacked foundation layer 50 along the Z axis.

In a specification of the application, a term of "stacked" includes the case where layers are stacked in contact with each other as well as the case where layers are stacked with another layer being interposed therebetween. A phrase of "provided on" includes the case where layers are provided in contact with each other as well as the case where layers are provided with another layer being interposed therebetween.

The functional layer 10s includes a low-concentration part 10l and a high-concentration part 10h. The low-concentration part 10l includes a nitride semiconductor and has a Si concentration less than $1\times10^{18}$ cm$^{-3}$. For example, the low-concentration part 10l has a Si concentration less than $1\times10^{17}$ cm$^{-3}$. For example, the Si concentration of the low-concentration part 10l is not more than a detection limit in a secondary ion mass spectrometry (SIMS) measurement generally used. For example, an undoped GaN layer is used as the low-concentration part 10l.

The high-concentration part 10h is provided on the low-concentration part 10l. In other words, the high-concentration part 10h is stacked on the low-concentration part 10l along the Z axis.

The high-concentration part 10h has a Si concentration not less than $1×10^{18}$ cm$^{-3}$. For example, an n-type GaN layer is used as the high-concentration part 10h.

The high-concentration part 10h is included in an n-type semiconductor layer 10. For convenience, it is assumed that the n-type semiconductor layer 10 includes the low-concentration part 10l.

In the stacked foundation layer 50, each of the plurality of AlN foundation layers 52 is, for example, a low-temperature AlN layer formed at low temperature. The thickness of each of the AlN foundation layers 52 is, for example, about 12 nm. The thickness of each of the GaN foundation layers 51 is, for example, about 300 nm. In the example, each of the number of the GaN foundation layers 51 and the number of the AlN foundation layers 52 (that is, the number of pairs) is three.

However, the embodiment is not limited to this, and any number of pairs may be employed.

The GaN foundation layer 51 closest to the silicon substrate 40 among the plurality of GaN foundation layers 51 is defined as a substrate-side GaN foundation layer 51s. The substrate-side GaN foundation layer 51s includes a first portion 51a, a second portion 51b and a third portion 51c. The third portion 51c is provided between the first portion 51a and the second portion 51b. The first portion 51a, the third portion 51c and the second portion 51b are stacked along the Z axis in this order.

The Si concentration of the first portion 51a and the second portion 51b is less than $5×10^{18}$ cm$^{-3}$. The Si concentration of the third portion 51c is not less than $5×10^{18}$ cm$^{-3}$. For example, the Si concentration of the third portion 51c is not more than $1×10^{21}$ cm$^{-3}$. The thickness of the third portion 51c (length along the Z axis) is smaller than a sum of the thickness of the first portion 51a and the thickness of the second portion 51b. The third portion 51c may contain silicon nitride (its composition ratio is optional), that is, $Si_\alpha N_\beta$ ($0<\alpha$, $0<\beta$).

The thickness of the third portion 51c is not less than 0.1 nm and not more than 50 nm. The third portion 51c is, for example, a δ-doped layer 51d.

The silicon substrate 40 is, for example, a Si (111) substrate. However, in the embodiment, the plane direction of the silicon substrate 40 is not necessarily a (111) plane.

A case where the nitride semiconductor device 110 is a light emitting device will be described below.

Figure 2:
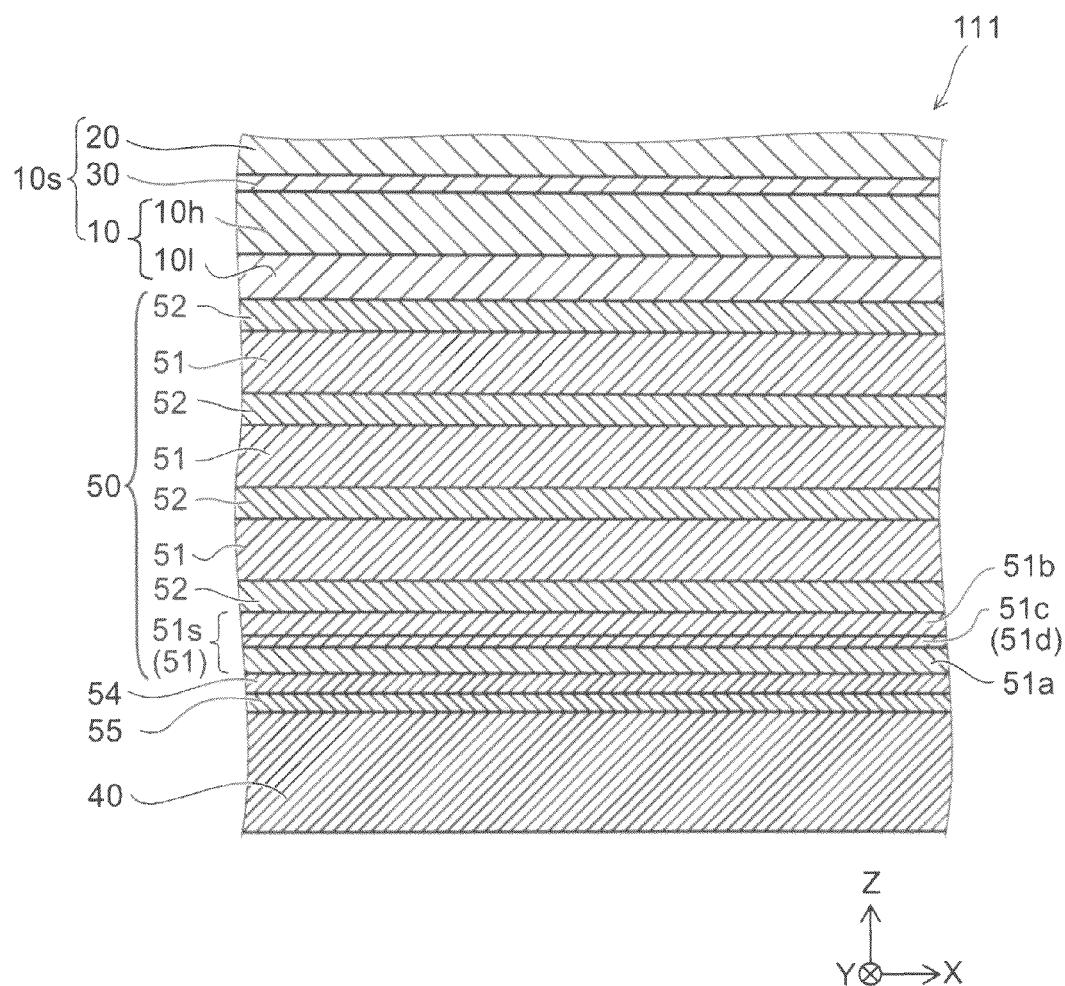
FIG. 2 is a schematic sectional view showing a nitride semiconductor device according to the first embodiment.

FIG. 2 is a schematic sectional view illustrating configuration of a nitride semiconductor device according to the first embodiment.

As shown in FIG. 2, in the nitride semiconductor device 111, which is an example according to the embodiment, the functional layer 10s further includes a light emitting part 30 and a p-type semiconductor layer 20.

The light emitting part 30 is provided on the n-type semiconductor layer 10 (the high-concentration part 10h). The p-type semiconductor layer 20 is provided on the light emitting part 30. The p-type semiconductor layer 20 includes a nitride semiconductor. The p-type semiconductor layer 20 includes at least one of Mg, Zn and C.

By supplying a current to the light emitting part 30 through the n-type semiconductor layer 10 and the p-type semiconductor layer 20, light is emitted from the light emitting part 30.

Figure 3:
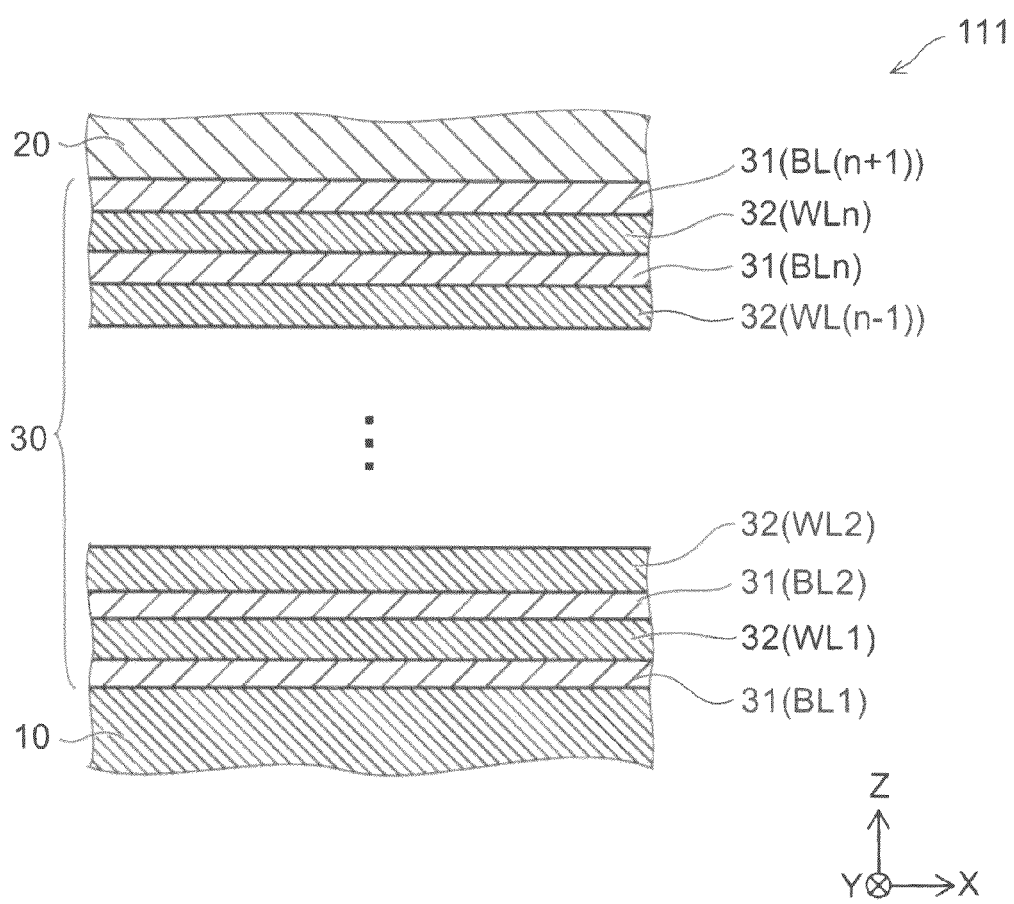
FIG. 3 is a schematic sectional view showing a part of the nitride semiconductor device according to the first embodiment.

FIG. 3 is a schematic sectional view illustrating configuration of a part of the nitride semiconductor device according to the first embodiment.

As shown in FIG. 3, the light emitting part 30 includes a plurality of barrier layers 31 and a plurality of well layers 32 each provided between the barrier layers 31. For example, the plurality of barrier layers 31 and the plurality of well layers 32 alternately stacked with the barrier layers 31 along the Z axis.

The well layer 32 contains, for example, $In_{x1}Ga_{1-x1}N$ ($0<x1<1$). The barrier layer 31 contains, for example, GaN. In other words, for example, the well layer 32 contains In and the barrier layer 31 does not substantially contain In. Bandgap energy in the barrier layer 31 is larger than bandgap energy in the well layer 32.

The light emitting part 30 may have Single Quantum Well (SQW) structure. At this time, the light emitting part 30 includes the two barrier layers 31 and the well layer 32 provided between the barrier layers 31. Alternatively, the light emitting part 30 may have Multi Quantum Well (MQW) structure. At this time, the light emitting part 30 includes the three or more barrier layers 31 and the well layers 32 each provided between the barrier layers 31.

In other words, the light emitting part 30 includes the (n+1) barrier layers 31 and the n well layers 32 ("n" is an integer of 2 or more). The (i+1)$^{th}$ barrier layer BL(i+1) is disposed between the i$^{th}$ barrier layer BLi and the p-type semiconductor layer 20 ("i" is an integer that is not less than 1 and not more than (n−1)). The (i+1)$^{th}$ well layer WL(i+1) is disposed between the i$^{th}$ well layer WLi and the p-type semiconductor layer 20. The first barrier layer BL1 is provided between the n-type semiconductor layer 10 and the first well layer WL1. The n$^{th}$ well layer WLn is provided between the n$^{th}$ barrier layer BLn and the (n+1)$^{th}$ barrier layer BL(n+1). The (n+1)$^{th}$ barrier layer BL(n+1) is provided between the n$^{th}$ well layer WLn and the p-type semiconductor layer 20.

The peak wavelength of light (emitted light) emitted from the light emitting part 30 is, for example, not less than 200 nanometers (nm) and not more than 1600 nm. However, in the embodiment, the peak wavelength is optional.

As described above, in the nitride semiconductor devices 110 and 111 according to the embodiment, the Si δ-doped layer 51d (the third portion 51c) is provided in the substrate-side GaN foundation layer 51s closest to the silicon substrate 40 among the plurality of GaN foundation layers 51. Thereby, it is possible to provide the high-quality nitride semiconductor device with reduced number of cracks formed on the silicon substrate.

Characteristics of the nitride semiconductor device of the embodiment will be described below while comparing with reference examples. Inventors fabricated following samples and evaluated their characteristics.

FIG. 4 to FIG. 7 are schematic sectional views illustrating configuration of first to fourth samples, respectively.

Figure 4:
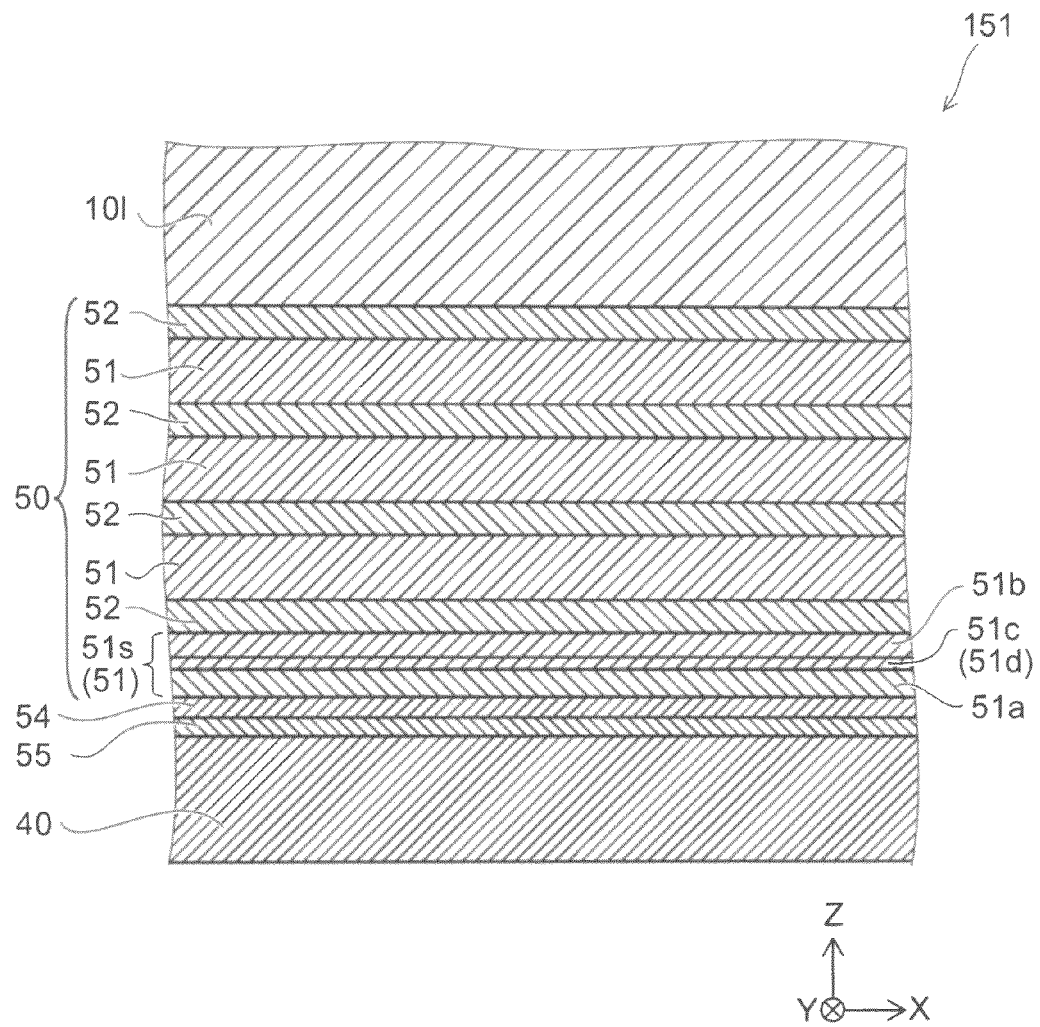
FIG. 4 is a schematic sectional view showing a first sample.

FIG. 4 shows the configuration of the first sample 151 corresponding to the embodiment. In the first sample 151, the Si δ-doped layer 51d (the third portion 51c) is provided in the substrate-side GaN foundation layer 51s closest to the silicon substrate 40 among the plurality of GaN foundation layers 51. However, in the first sample 151, no high-concentration part 10h is provided. In other words, the first sample 151 is in the state before the high-concentration part 10h is provided on the low-concentration part 10l in the configuration of the embodiment.

Figure 5:
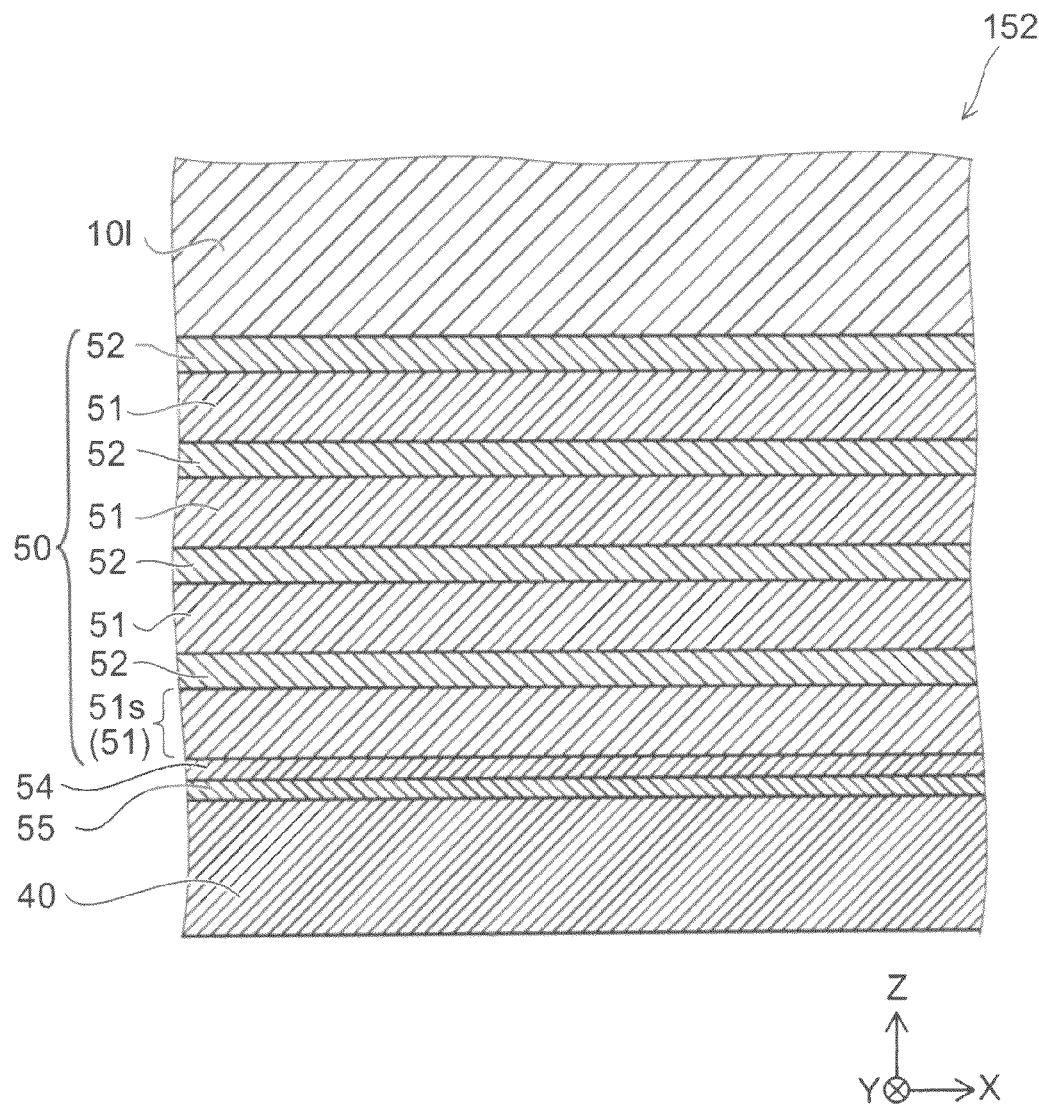
FIG. 5 is a schematic sectional view showing a second sample.

As shown in FIG. 5, in the second sample 152, no δ-doped layer 51d (the third portion 51c) is provided in all of the plurality of GaN foundation layers 51.

Figure 6:
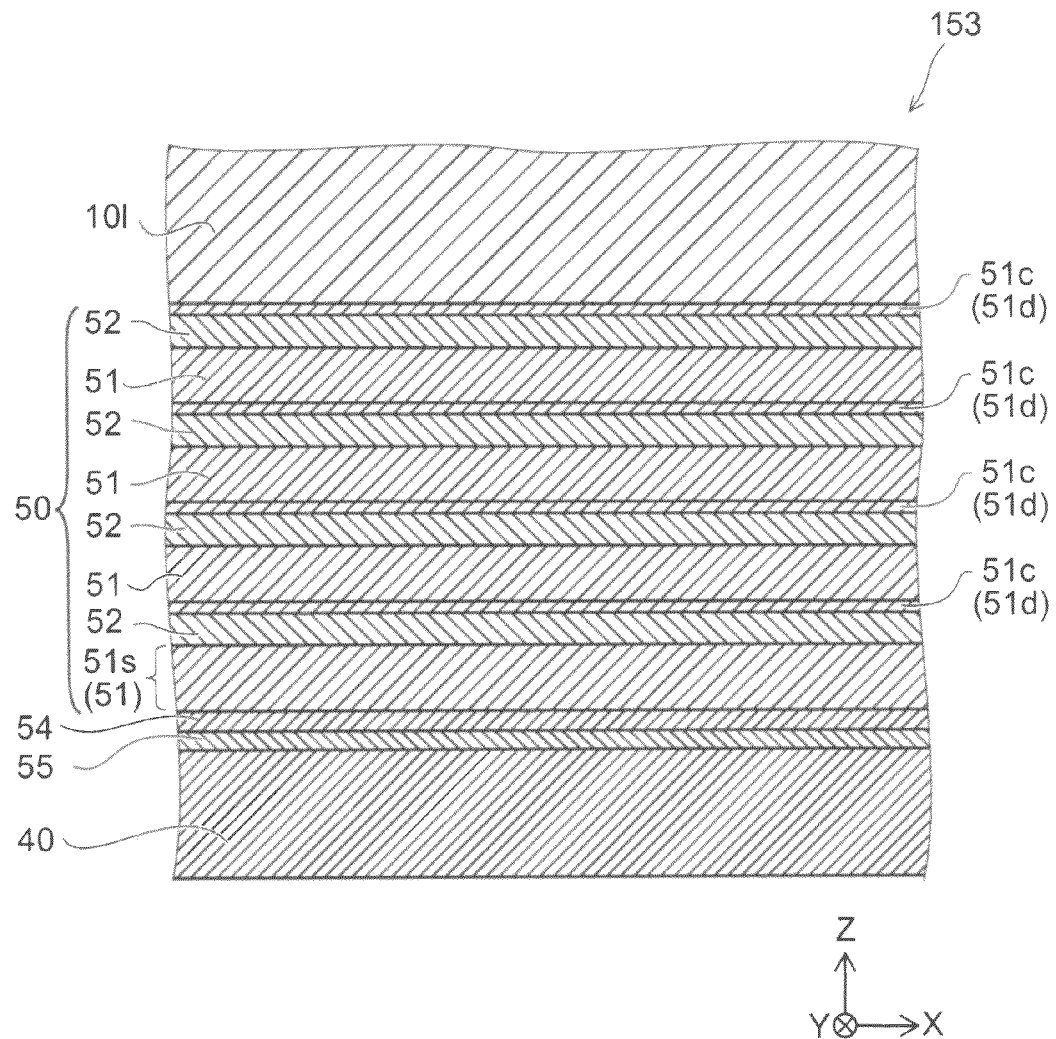
FIG. 6 is a schematic sectional view showing a third sample.

As shown in FIG. 6, in the third sample 153, the δ-doped layer 51d (the third portion 51c) is provided on the upper side of the AlN foundation layer 52 and in contact with the AlN foundation layer 52.

Figure 7:
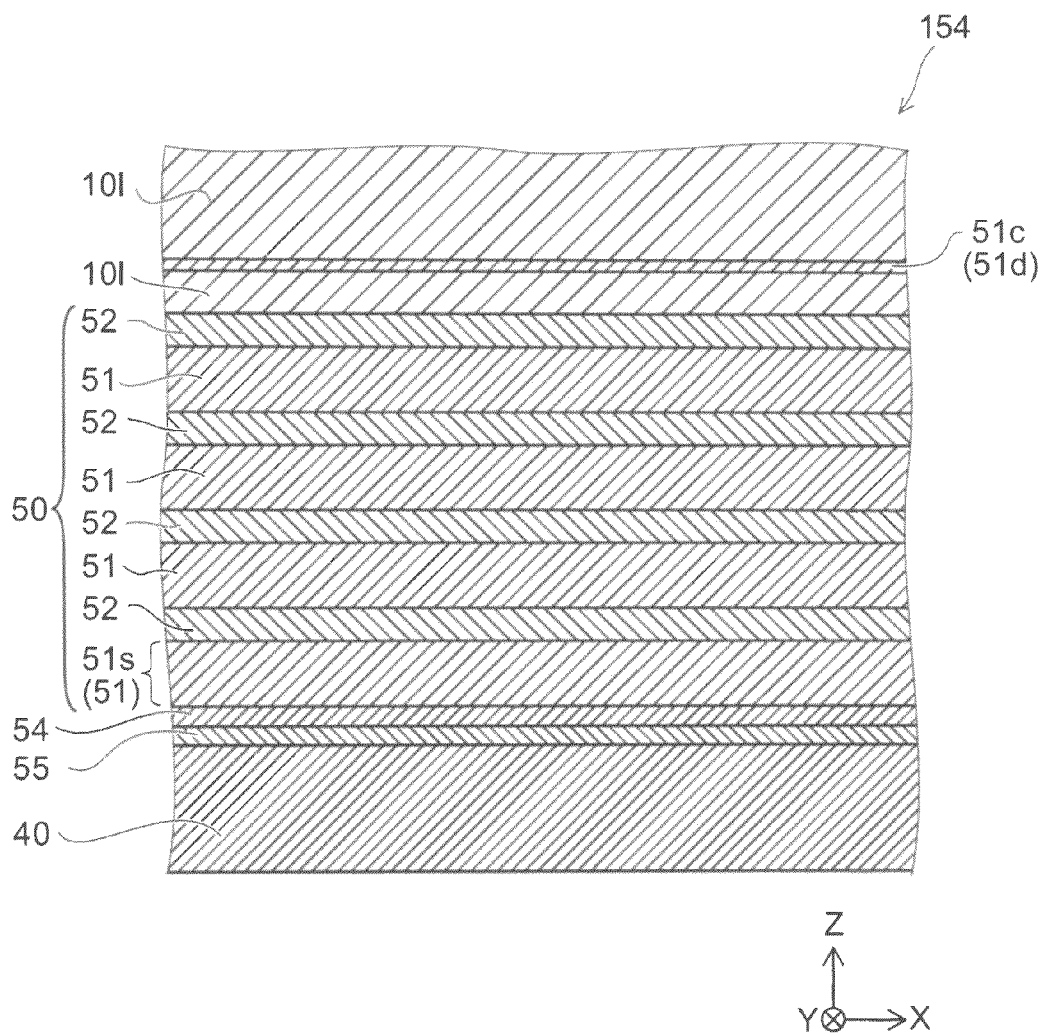
FIG. 7 is a schematic sectional view showing a fourth sample.

As shown in FIG. 7, in the fourth sample 154, no δ-doped layer 51d (the third portion 51c) is provided in all of the plurality of GaN foundation layers 51. The δ-doped layer 51d (the third portion 51c) is provided in the low-concentration part 10l.

The first sample 151 was fabricated by a following fabrication method. In the following experiments, an MOVPE (Metal-Organic Vapor Phase Epitaxy) was employed as a crystal growth of the semiconductor layer.

First, the Si(111) silicon substrate 40 was cleaned by using a mixed solution of $H_2O_2$ and $H_2SO_4$ (1:1) for 13 minutes. Next, the silicon substrate 40 was cleaned by using 2% HF for 10 minutes. After cleaning, the silicon substrate 40 was introduced into an MOVPE reactor.

The temperature of a susceptor was increased to 720° C. under hydrogen atmosphere and TMA was supplied for eight seconds. Then, $NH_3$ was further supplied to form an AlN layer having a thickness of 30 nm serving as the AlN buffer layer 55.

Subsequently, the temperature of the susceptor was increased to 1030° C. to form an $Al_{0.25}Ga_{0.75}N$ layer having a thickness of 40 nm serving as the intermediate layer 54.

Next, the temperature of the susceptor was increased to 1080° C. to form a GaN layer having a thickness of 150 nm serving as a part (the first portion 51a) of the substrate-side GaN foundation layer 51s. Then, supply of gas was interrupted and only $SiH_4$ and $NH_3$ were supplied for 300 seconds to form the Si δ-doped layer 51d.

Subsequently, a GaN layer having a thickness of 150 nm was formed as a part (the second portion 51b) of the substrate-side GaN foundation layer 51s.

Next, the temperature of the susceptor was decreased to 800° C. to form a low-temperature AlN layer having a thickness of 12 nm serving as the AlN foundation layer 52.

Next, the temperature of the susceptor was increased to 1120° C. to form a GaN layer having a thickness of 300 nm serving as the GaN foundation layer 51. Furthermore, growth of the above-mentioned AlN foundation layer 52 and GaN foundation layer 51 was repeated three times. Thereby, the stacked foundation layer 50 was formed.

Subsequently, a GaN layer having a thickness of 2.1 μm was formed as the low-concentration part 10l. Thereby, the first sample 151 was obtained.

By omitting formation of the δ-doped layer 51d in the above-mentioned process, the second sample 152 was obtained.

By changing the formation timing of the δ-doped layer 51d in the above-mentioned process, the third sample 153 was obtained.

By forming the δ-doped layer 51d during fabrication of the low-concentration part 10l, the fourth sample 154 was obtained. In this experiment, the δ-doped layer 51d is provided at a position away from the uppermost AlN foundation layer 52 by 300 nm.

The above-mentioned first sample 151 to the fourth sample 154 were observed by using a Nomarski microscope.

FIG. 8A to FIG. 8D are Nomarski microscope images illustrating characteristics of the first to fourth samples.

Figure 8A:
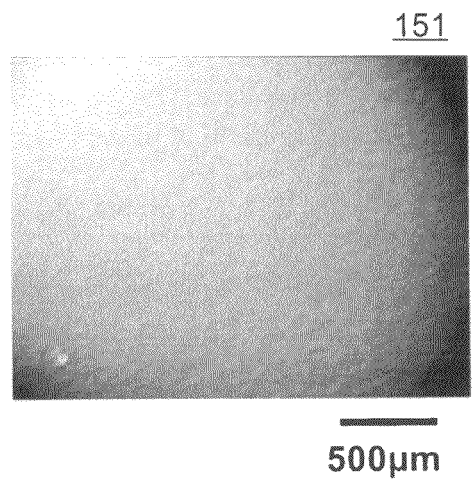
FIG. 8A to FIG. 8D are Nomarski microscope images showing characteristics of the first to fourth samples.

As shown in FIG. 8A, in the first sample 151, a surface without crack was obtained. A rocking curve of the wafer was measured by using an X-ray diffractometer. In the first sample 151, the full width at half maximum of a (002) plane was 364 arcseconds and the full width at half maximum of a (101) plane was 817 arcseconds. The full width at half maximum of the (002) plane is highly correlated to screw dislocation density and the full width at half maximum of the (101) plane is highly correlated to edge dislocation density. Thus, the first sample 151 has a low defect density.

Figure 8B:
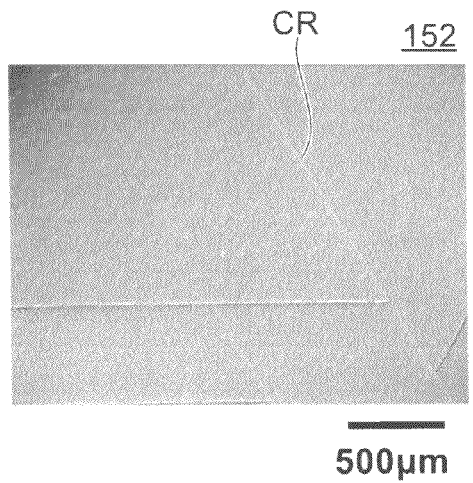

As shown in FIG. 8B, in the second sample 152, a crack CR was observed. In the second sample 152, the full width at half maximum of the (002) plane was 452 arcseconds and the full width at half maximum of the (101) plane was 1488 arcseconds. Thus, the second sample 152 has a higher defect density than the first sample.

Figure 8C:
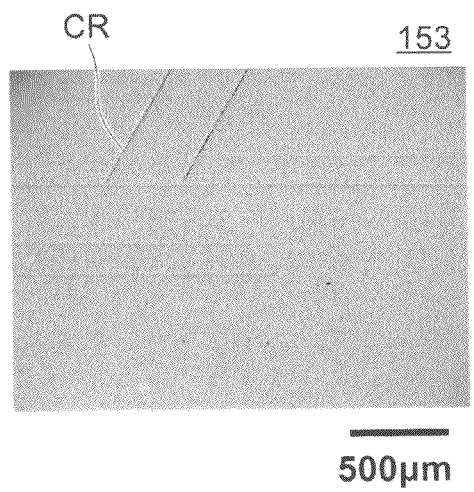

As shown in FIG. 8C, also in the third sample 153, the crack CR was observed. The full width at half maximum of the (002) plane was 364 arcseconds and the full width at half maximum of the (101) plane was 999 arcseconds. Although improved from the second sample, the third sample 153 has the crack CR and characteristics of the semiconductor device formed on the wafer are poor. It is considered that, in the case where the δ-doped layer 51d is provided in a region within 100 nm from the low-temperature AlN layer, the effect of reducing the dislocation by the δ-doped layer 51d is obtained, the effect of applying the compressive strain due to formation of the GaN foundation layers 51 thereon cannot be brought about.

Figure 8D:
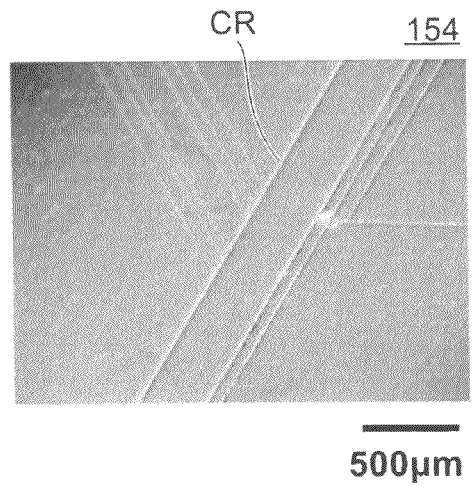

As shown in FIG. 8D, in the fourth sample 154, many cracks CR were observed. The full width at half maximum of the (002) plane was 583 arcseconds and the full width at half maximum of the (101) plane was 1578 arcseconds. Characteristics of the semiconductor device formed on such wafer are poor.

As described above, in the first sample 151 in which the Si δ-doped layer 51d (the third portion 51c) is provided in the substrate-side GaN foundation layer 51s closest to the silicon substrate 40 among the plurality of GaN foundation layers 51, the generation of the crack CR is suppressed. In addition, defect density is low. By further forming the high-concentration part 10h on the first sample 151 recited above, it is possible to provide the high-quality nitride semiconductor device with low defect density in which the generation of the crack CR is suppressed.

The thickness of the low-concentration part 10l and the thickness of the high-concentration part 10h are appropriately adjusted from viewpoints of the generation of crack and defect.

In the embodiment, the AlN foundation layer 52 does not match in lattice with the GaN foundation layer 51 located immediately therebelow. As a result, the strain is relaxed and the AlN foundation layer 52 has a lattice constant of AlN which is not affected by the influence of the strain. By forming the GaN foundation layer 51 so as to grow pseudomorphically on the AlN foundation layer 52, GaN grows while being subjected to compressive strain. This results in a convex warp.

Further, by repeatedly forming these AlN layers and GaN layers, the warp further protruding upwards can be made large. By previously introducing the warp protruding upwards during crystal growth, tensile strain which is applied in decreasing temperature after crystal growth due to difference between thermal expansion coefficients of Si and GaN, can be compensated. This promotes suppression of the generation of crack.

In addition to suppressing the generation of crack, formation of the GaN foundation layers 51 can terminate defects such as threading dislocation due to lattice mismatching between the silicon substrate 40 and the nitride semiconductor layer. Thereby, extending of detects to the functional layer 10s can be suppressed. As a result, with the embodiment, the high-performance device can be achieved.

By providing the δ-doped layer 51d in the lowermost substrate-side GaN foundation layer 51s in the stacked foundation layer 50, dislocation extending in the stacking direction (the Z-axis direction) is curved. As a result, dislocation in the functional layer 10s can be reduced. Further, since GaN grows in three-dimensional way in further forming the GaN foundation layers 51 on the δ-doped layer 51d, compressive strain protruding upwards tends to be generated during crystal growth, thereby the generation of crack can easily suppressed.

In the embodiment, when the number of GaN foundation layers 51 included in the stacked foundation layer 50 (the number of stacking periods) is less than 20, for example, it is noted that the thickness of the GaN foundation layer 51 be not less than 50 nm and not more than 1000 nm. When the thickness is smaller than 50 nm, the effect of reducing dislocation such as threading dislocation generated between the silicon substrate 40 and the stacked foundation layer 50 is insufficient. When the thickness is larger than 1000 nm, crack caused by tensile strain in decreasing temperature after crystal growth tends to be generated.

When the number of GaN foundation layers 51 included in the stacked foundation layer 50 is not less than 20, for example, it is noted that the thickness of the GaN foundation layer 51 be not less than 15 nm and not more than 100 nm. When the thickness is smaller than 15 nm, the effect of reducing dislocation is insufficient. When the thickness is larger than 100 nm, crack caused by tensile strain tends to be generated.

It is noted that the thickness of the AlN foundation layers 52 (the low-temperature AlN layer) be, for example, not less than 5 nm and not more than 20 nm. It is noted that the crystal growth temperature of the AlN foundation layer 52 be, for example, not less than 600° C. and not more than 1050° C. By setting the thickness and the temperature in these ranges, the lattice of the AlN foundation layer 52 is easily relaxed. Thereby, in forming the AlN foundation layer 52, it becomes hard to be subject to tensile strain from the GaN foundation layers 51 serving as a foundation. As a result, it is possible to efficiently form the lattice constant of AlN that is not affected by strain from the GaN foundation layers 51 serving as a foundation.

When the thickness of the AlN foundation layers 52 is smaller than 5 nm, it is difficult that AlN is sufficiently relaxed. When the thickness of the AlN foundation layer 52 is larger than 20 nm, dislocation due to lattice relaxation increases.

When the formation temperature of the AlN foundation layers 52 is lower than 600° C., impurities are easily incorporated and furthermore, cubic crystal AlN grows, causing excessive generation of crystal dislocation. When the formation temperature of the AlN foundation layer 52 is higher than 1050° C., strain is not relaxed and thus, tensile strain is easily introduced into the silicon substrate 40. Furthermore, since compressive strain cannot be appropriately applied during crystal growth of the GaN foundation layer 51, crack tends to be generated in decreasing temperature after crystal growth.

By setting the number of AlN foundation layers 52 to two or more, the effect of suppressing the generation of crack is improved. It is noted that the distance between the AlN foundation layers 52 (that is, the thickness of the GaN foundation layer 51) be not less the 50 nm and not more than 1000 nm.

In forming the GaN foundation layer 51 on the AlN foundation layer 52, the GaN foundation layer 51 having a thickness not less than 50 nm and not more than 200 nm grows pseudomorphically on AlN foundation layer 52 and is tend to be subjected to compressive strain. Accordingly, when the distance between the AlN foundation layers 52 is larger than 1000 nm, the effect of applying compressive strain is insufficient. When the distance is smaller than 50 nm, the number of AlN foundation layers 52 in the GaN foundation layer 51 becomes excessively many and therefore, the temperature increase and decrease process is excessively repeated, decreasing the material use efficiency of the crystal growth apparatus and the like.

The δ-doped layer 51d contains Si with a concentration not less than $5\times10^{18}$ cm$^{-3}$ and not more than $1\times10^{22}$ cm$^{-3}$ mainly in GaN. The δ-doped layer 51d may contain SiN. In the δ-doped layer 51d, SiN may be partially formed in the plane. It is noted that the thickness of the δ-doped layer 51d be not less than 0.1 nm and not more than 50 nm. When the Si concentration is not less than $5\times10^{18}$ cm$^{-3}$ and not more than $1\times10^{22}$ cm$^{-3}$, the GaN foundation layer 51 formed on the δ-doped layer 51d tends to grow in a three-dimensional way. Thereby, it becomes easy to apply compressive strain, resulting in that the effect of suppressing the generation of crack is easily obtained.

As described above, in the embodiment, dislocation and crack in the functional layer 10s are reduced. Further, crystallinity of the functional layer 10s is improved. That is, the functional layer 10s has high quality.

According to the Inventors' experiment, when the δ-doped layer 51d is formed in the GaN foundation layer 51 closest to the functional layer 10s among the plurality of GaN foundation layers 51, the effect of suppressing the generation of the crack CR was small. In the embodiment, it is especially noted that the δ-doped layer 51d be provided in the substrate-side GaN foundation layer 51s. For example, it is further noted that no δ-doped layer 51d be provided in all of the GaN foundation layers 51 except for the substrate-side GaN foundation layer 51s among the plurality of GaN foundation layers 51. For example, it is further noted that all of the GaN foundation layers 51 except for the substrate-side GaN foundation layer 51s have the Si concentration less than $5\times10^{18}$ cm$^{-3}$.

Figure 9:
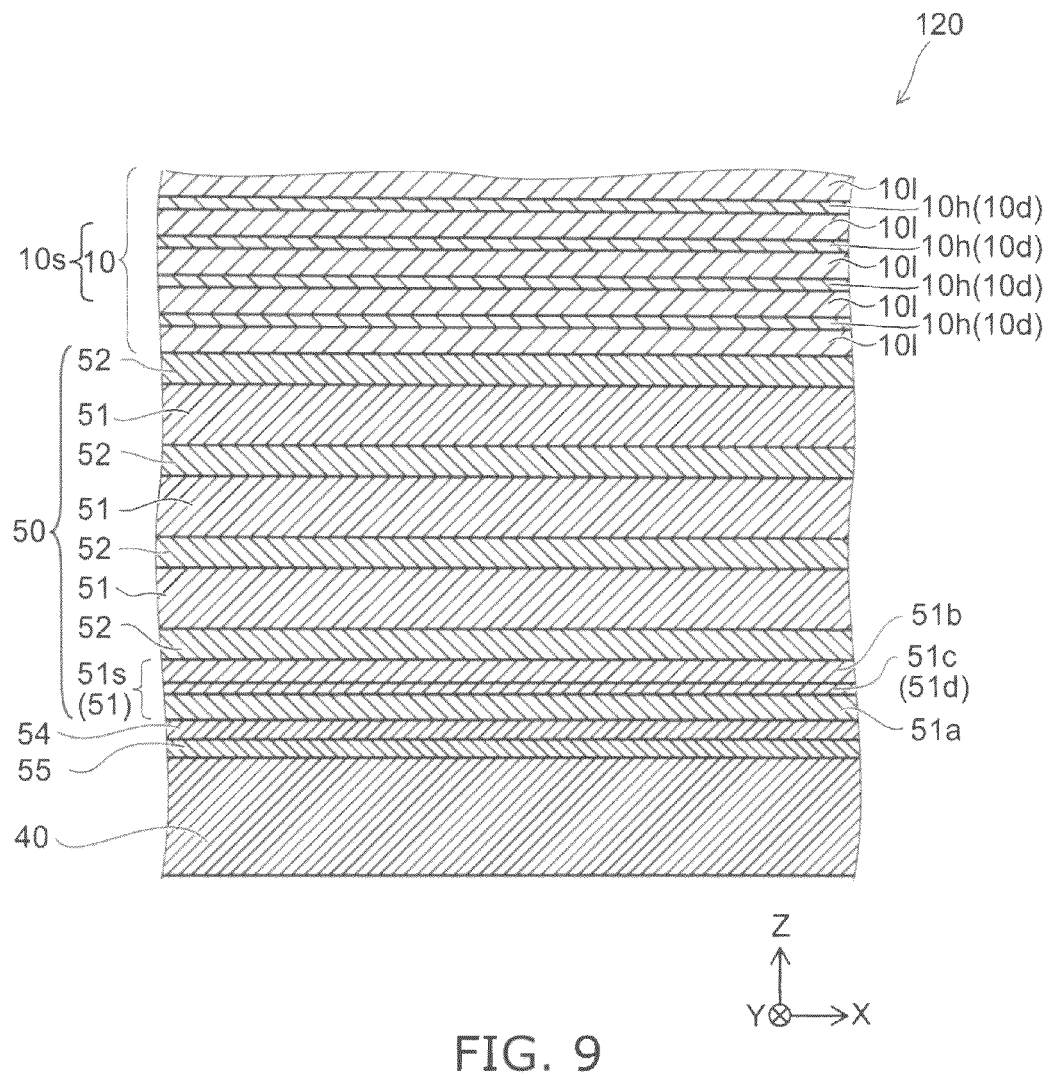
FIG. 9 is a schematic sectional view showing another nitride semiconductor device according to the first embodiment.

FIG. 9 is a schematic sectional view illustrating configuration of another nitride semiconductor device according to the first embodiment.

As shown in FIG. 9, in another nitride semiconductor device 120 according to the embodiment, the functional layer 10s includes a plurality of low-concentration parts 10l and a plurality of high-concentration parts 10h. The thickness of each of the plurality of high-concentration parts 10h is smaller than the thickness of each of the low-concentration parts 10l. The plurality of low-concentration parts 10l and the plurality of high-concentration parts 10h are alternately disposed. In other words, the plurality of low-concentration parts 10l and the plurality of high-concentration parts 10h are alternately stacked along the Z axis. In the example, each of the high-concentration parts 10h is a Si δ-doped layer 10d. Other configuration of the nitride semiconductor device 120 is the same as that of the nitride semiconductor device 110 and thus, description thereof is omitted.

By alternately stacking the plurality of low-concentration parts 10l and the plurality of high-concentration parts 10h in this manner, a layer including the plurality of low-concentration parts 10l and the plurality of high-concentration parts 10h can be regarded as the n-type semiconductor layer 10. In other words, in the specific example, the n-type semiconductor layer 10 is δ-doped with Si.

In the example, the thickness of each of the plurality of high-concentration parts 10h (the δ-doped layers 10d) is not less than 0.1 nm and not more than 50 nm. The distance between the plurality of high-concentration parts 10h (the δ-doped layers 10d), that is, the thickness of each of the plurality of low-concentration parts 10l, is not less than 300 nm and not more than 500 nm.

In the nitride semiconductor device 120, the thickness of the n-type semiconductor layer 10 is, for example, 2.1 μm.

Figure 10:
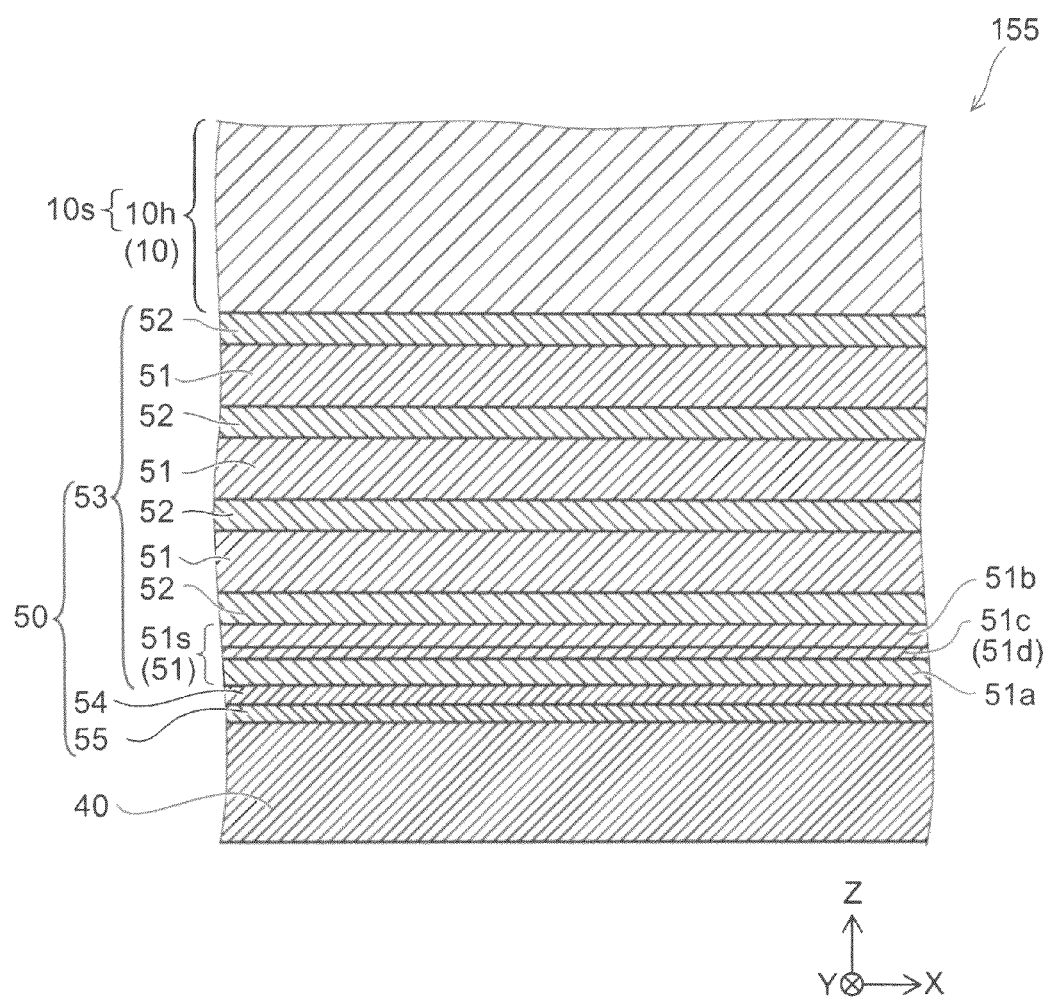
FIG. 10 is a schematic sectional view showing a fifth sample of the nitride semiconductor device.

FIG. 10 is a schematic sectional view illustrating configuration of a fifth sample of the nitride semiconductor device.

As shown in FIG. 10, in the nitride semiconductor device of the fifth sample 155, the n-type semiconductor layer 10 is provided directly on the stacked foundation layer 50. Also in this case, the thickness of the n-type semiconductor layer 10 is, for example, 2.1 μm. In the fifth sample 155, no δ-doped layer 10d is provided in the n-type semiconductor layer 10. That is, Si is doped in a wide region along the Z axis of the n-type semiconductor layer 10.

Figure 11A:
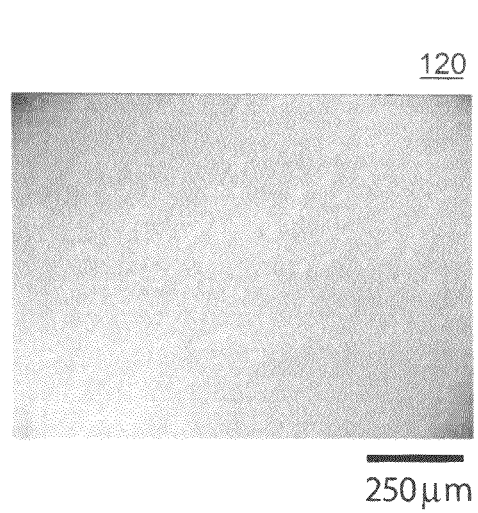
FIG. 11A and FIG. 11B are Nomarski microscope images showing characteristics of the nitride semiconductor devices.
Figure 11B:
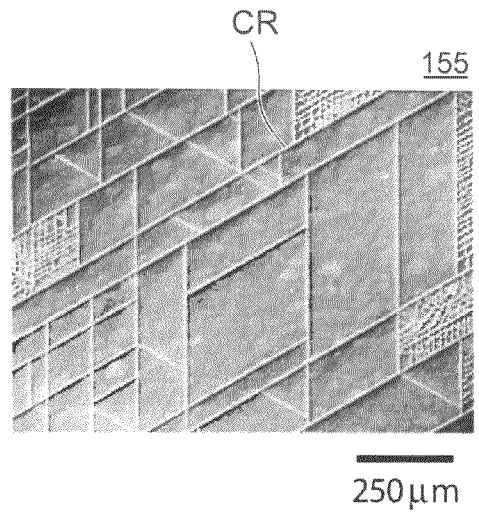

FIG. 11A and FIG. 11B are Nomarski microscope images illustrating characteristics of the nitride semiconductor device.

As shown in FIG. 11A, in the nitride semiconductor device 120 according to the embodiment, no crack CR was observed on the surface.

As shown in FIG. 11B, in the nitride semiconductor device of the fifth sample 155, a highly-densed crack CR were generated on the surface. This means that, in the fifth sample 155, since Si is uniformly doped in the functional layer 10s (the n-type semiconductor layer 10), tensile strain is applied, thereby easily causing crack. Therefore, characteristics of the semiconductor device formed on such wafer are poor.

Especially when the thickness of the Si-doped GaN layer is not less than 1.5 μm, crack density tends to become very high. Accordingly, when the embodiment is applied to formation of the n-type GaN layer having a thickness not less than 1.5 μm, the effect of suppressing the generation of the crack CR can be effectively obtained.

The nitride semiconductor device 120 according to the embodiment is used as at least a part of the n-type semiconductor layer 10 such as the light emitting diode and the laser diode to produce a larger effect. In the light emitting diode and the laser diode, the thickness of the n-type semiconductor layer 10 is generally not less than 2 μm. If the thickness of the n-type semiconductor layer 10 in such semiconductor light emitting device is not more than 1.5 μm, current spreading is insufficient, and thus, for example, in-plane light emission pattern becomes nonuniform. In addition, this disadvantageously leads to high resistance.

Comparing the first sample 151 described with reference to FIG. 4 with the second sample 152 described with reference to FIG. 5, crack density is reduced by providing the δ-doped layer 51d in the stacked foundation layer 50. It is considered that, like the AlN foundation layer 52 (the low-temperature AlN layer), the GaN foundation layer 51 grown on the δ-doped layer 51d is subjected to compressive strain and warp protruding upwards is previously stored during crystal growth to compensate tensile strain due to difference between thermal expansion coefficients of the GaN foundation layer 51 and the Si substrate in decreasing temperature after crystal growth As described above, by providing the δ-doped layer 51d in the GaN foundation layers 51, the generation of the crack CR can be suppressed. Similarly, by periodically providing the δ-doped layers 10d in the functional layer 10s, the generation of the crack CR can be suppressed. In this case, the GaN layer in which the δ-doped layers 10d are periodically provided becomes the n-type semiconductor layer 10.

In the case where the low-temperature AlN layers are periodically provided in the functional layer 10s, since the bandgap energy of AlN (6.3 eV) is much larger than the bandgap energy of GaN (3.4 eV), the current flow is interrupt and it cannot function as an n-type GaN layer.

It is known an effect of reducing dislocation by forming the δ-doped layer (SiN layer) and an effect of suppressing the generation of the crack CR by crystal growing the GaN layer on the δ-doped layer to introduce compressive strain. However, the effect obtained by arrangement of the δ-doped layer (the δ-doped layer 51d) is not known. Further, the technique of providing the plurality of δ-doped layers 10d in the functional layer 10s (for example, periodically) to form the thick (for example, 1.5 μm or more) n-type semiconductor layer 10 is not also known.

Based on the above-mentioned phenomenon found by Inventors' unique experiment, the configuration of the embodiment is constructed. Thereby, it is possible to provide the wafer having a high-quality nitride semiconductor crystal formed on the Si substrate.

In the example of the nitride semiconductor device 120, the stacked foundation layer 50 is provided. However, in the case where the plurality of δ-doped layers 10d is provided in the functional layer 10s, the stacked foundation layer 50 is not necessarily provided. For example, arbitral structure that applies compressive strain during growth may be provided between the functional layer 10s and the AlN buffer layer 55. For example, an AlN/GaN superlattice structure or a structure in which Al composition is inclined in a stepped manner or continuously may be provided between the functional layer 10s and the AlN buffer layer 55.

That is, the semiconductor light emitting device according to the embodiment may further include the stacked foundation layer 50 formed on the AlN buffer layer 55 and under the functional layer 10s. The stacked foundation layer 50 includes the plurality of AlN foundation layers 52 and the plurality of GaN foundation layers 51 alternately stacked with the AlN foundation layers 52. The substrate-side GaN foundation layer 51s closest to the silicon substrate 40 among the plurality of GaN foundation layers 51 can have the first portion 51a having a Si concentration less than $5 \times 10^{18}$ cm$^{-3}$, the second portion 51b having a Si concentration less than $5 \times 10^{18}$ cm$^{-3}$ and the third portion 51c that is provided between the first portion 51a and the second portion 51b, has a Si concentration not less than $5 \times 10^{18}$ cm$^{-3}$ and has a thickness smaller than a sum of the thickness of the first portion 51a and the thickness of the second portion 51b.

Figure 12:
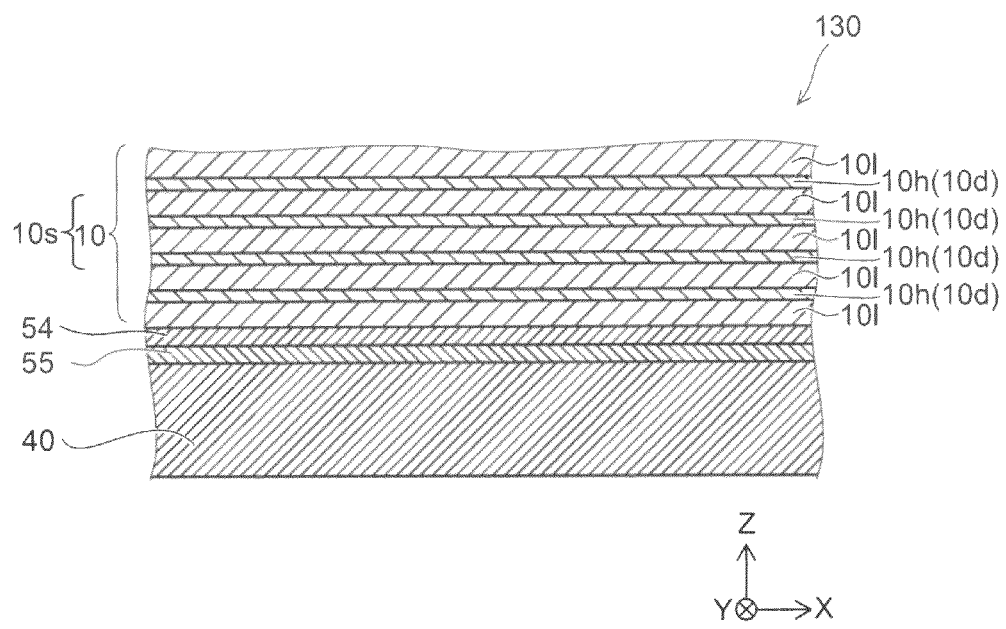
FIG. 12 is a schematic sectional view showing another nitride semiconductor device according to the first embodiment.

FIG. 12 is a schematic sectional view illustrating configuration of another nitride semiconductor device according to the first embodiment.

As shown in FIG. 12, another nitride semiconductor device 130 according to the embodiment includes the functional layer 10s formed on the AlN buffer layer 55 formed on the silicon substrate 40. In the example, the intermediate layer 54 is provided on the AlN buffer layer 55 and the functional layer 10s is provided on the intermediate layer 54. The intermediate layer 54 is provided as needed and may be omitted according to circumstances. The functional layer 10s includes the plurality of low-concentration parts 10l and the plurality of high-concentration parts 10h (for example, δ-doped layer 10d) alternately stacked with the low-concentration parts 10l.

Each of the plurality of low-concentration parts 10l includes the nitride semiconductor and has a Si concentration less than $5 \times 10^{18}$ cm$^{-3}$. Each of the plurality of high-concentration parts 10h has a Si concentration not less than $5 \times 10^{18}$ cm$^{-3}$. The thickness of each of the plurality of high-concentration parts 10h is smaller than the thickness of each of the low-concentration parts 10l.

Thereby, it is possible to provide the high-quality nitride semiconductor device with the reduced number of cracks formed on the silicon substrate.

It is noted that the distance (for example, a period) between the δ-doped layers 10d in the functional layer 10s be not less than 50 nm and not more than 500 nm. When the distance is smaller than 50 nm, the doping concentration of the GaN layer becomes too high. The effect obtained by applying compressive strain cannot be sufficiently obtained. When the distance (for example, period) is larger than 500 nm, it is noted that the number of δ-doped layers 10d be not less than two and not more than 80.

The part except for the δ-doped layers 10d in the n-type semiconductor layer 10 may contain Si having a concentration not more than a half of the Si concentration in the δ-doped layers 10d.

(Second Embodiment)

The embodiment relates to a nitride semiconductor wafer. The wafer is provided with, for example, at least a part of the semiconductor devices, or a portion that becomes at least a part of the semiconductor devices. Examples of the semiconductor devices include the semiconductor light emitting device, the semiconductor light receiving device and the electronic device.

Figure 13:
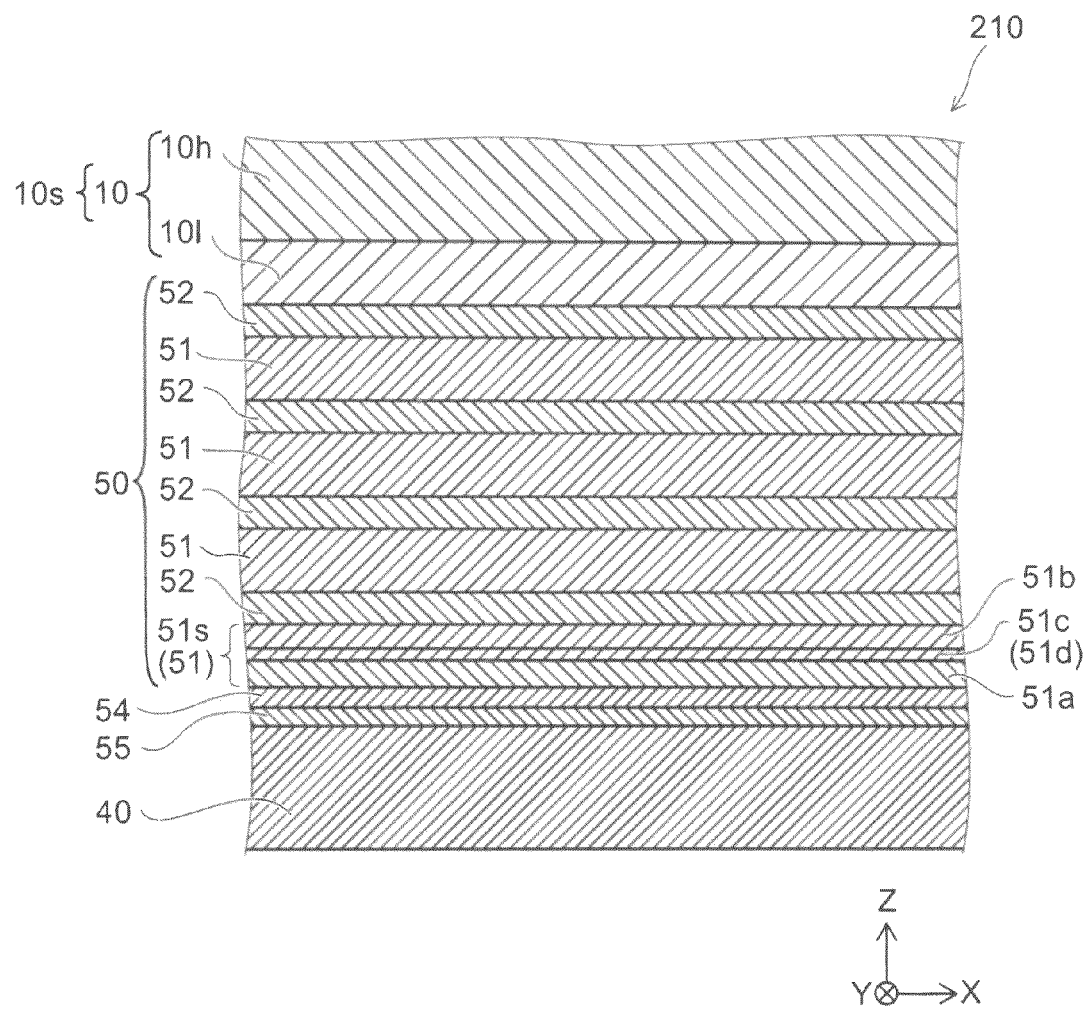
FIG. 13 is a schematic sectional view showing a nitride semiconductor wafer according to a second embodiment.

FIG. 13 is a schematic sectional view illustrating configuration of the nitride semiconductor wafer according to the second embodiment.

As shown in FIG. 13, a nitride semiconductor wafer 210 according to the embodiment includes the silicon substrate 40, the AlN buffer layer 55, the stacked foundation layer 50 and the functional layer 10s. In the example, the nitride semiconductor wafer 210 further includes the intermediate layer 54. The intermediate layer 54 may be omitted.

In the nitride semiconductor wafer 210, the configuration described with respect to the first embodiment can be applied to each of the silicon substrate 40, the AlN buffer layer 55, the intermediate layer 54, the stacked foundation layer 50 and the functional layer 10s.

That is, the substrate-side GaN foundation layer 51s closest to the silicon substrate 40 among the plurality of GaN foundation layers 51s included in the stacked foundation layer 50 includes the first portion 51a having a Si concentration less than $5 \times 10^{18}$ cm$^{-3}$, the second portion 51b having a Si concentration less than $5 \times 10^{18}$ cm$^{-3}$ and the third portion 51c that is provided between the first portion 51a and the second portion 51b. The third portion 51c has a Si concentration not less than $5 \times 10^{18}$ cm$^{-3}$ and has a thickness smaller than the sum of the thickness of the first portion 51a and the thickness of the second portion 51b.

Figure 14:
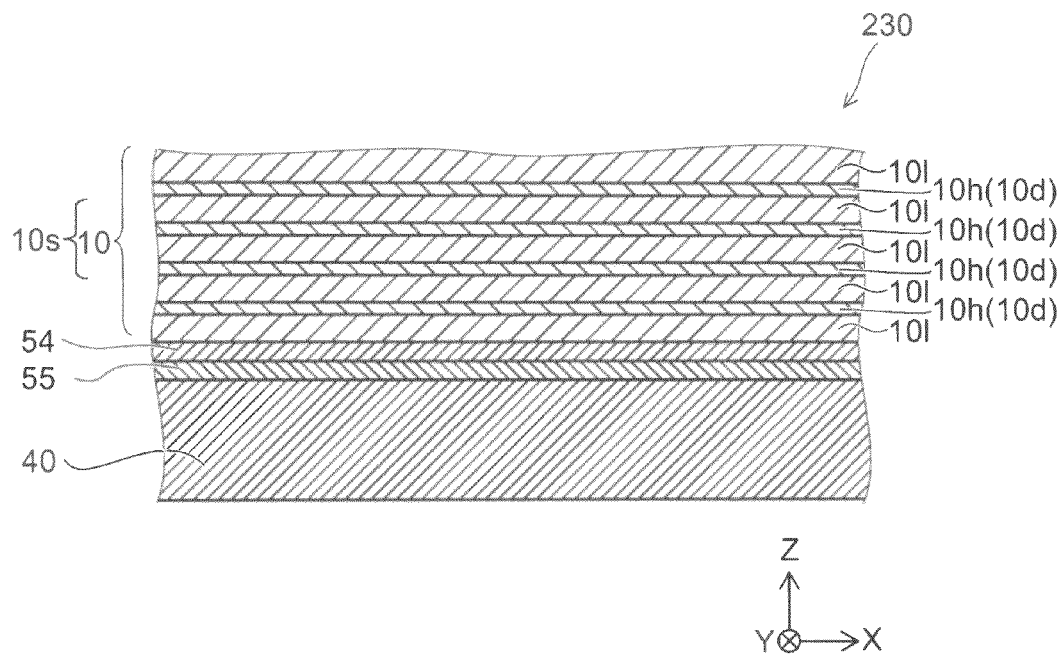
FIG. 14 is a schematic sectional view showing another nitride semiconductor wafer according to the second embodiment.

FIG. 14 is a schematic sectional view illustrating configuration of another nitride semiconductor wafer according to the second embodiment.

As shown in FIG. 14, another nitride semiconductor wafer 230 according to the embodiment includes the silicon substrate 40, the AlN buffer layer 55 provided on the silicon substrate 40 and the functional layer provided on the AlN buffer layer 55. In the example, the nitride semiconductor wafer 230 further includes the intermediate layer 54. The intermediate layer 54 may be omitted.

The functional layer 10s includes the plurality of low-concentration parts 10l and the plurality of high-concentration parts 10h (for example, the δ-doped layers 10d) alternately stacked with the low-concentration parts 10l. Each of the plurality of low-concentration parts 10l includes the nitride semiconductor and has a Si concentration less than $5 \times 10^{18}$ cm$^{-3}$. Each of the plurality of high-concentration parts 10h has a Si concentration not less than $5 \times 10^{18}$ cm$^{-3}$. The thickness of each of the plurality of high-concentration parts 10h is smaller than that of each of the low-concentration parts 10l.

By using the nitride semiconductor wafers 210 and 230, it is possible to provide the nitride semiconductor wafer for the high-quality nitride semiconductor device with the reduced number of cracks formed on the silicon substrate.

(Third Embodiment)

Figure 15:
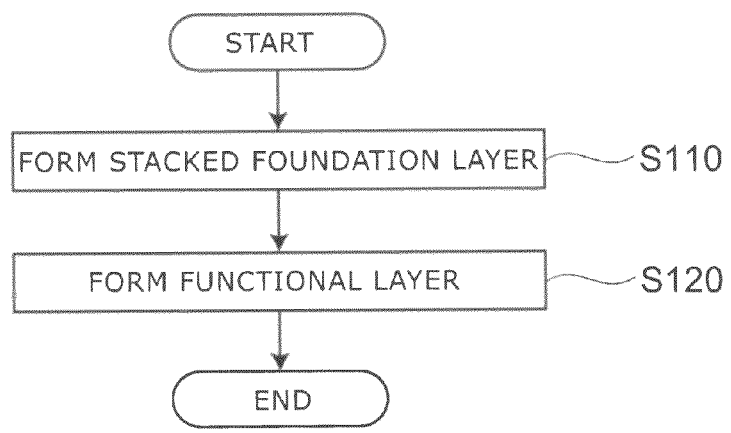
FIG. 15 is a flow chart showing a method for manufacturing a nitride semiconductor layer according to a third embodiment.

FIG. 15 is a flow chart illustrating a method for manufacturing the nitride semiconductor layer according to a third embodiment.

As shown in FIG. 15, in the manufacturing method, the plurality of AlN foundation layers 52 and the plurality of GaN foundation layers 51 are alternately stacked on the AlN buffer layer 55 provided on the silicon substrate 40 to form the stacked foundation layer 50 (Step S110). Further, the low-concentration part 10l that includes the nitride semiconductor and has a Si concentration less than $5 \times 10^{18}$ cm$^{-3}$ is formed on the stacked foundation layer 50 and the high-concentration part 10h having a Si concentration not less than $5 \times 10^{18}$ cm$^{-3}$ is formed on the low-concentration part 10l to form the functional layer 10s (Step S120).

Forming the stacked foundation layer 50 includes, in formation of the substrate-side GaN foundation layer 51s closest to the silicon substrate 40 among the plurality of GaN foundation layers 51, forming the first portion 51a having a Si concentration less than $5 \times 10^{18}$ cm$^{-3}$, the second portion 51b having a Si concentration less than $5 \times 10^{18}$ cm$^{-3}$ and the third portion 51c that is provided between the first portion 51a and the second portion 51b, has a Si concentration not less than $5 \times 10^{18}$ cm$^{-3}$ and has a thickness smaller than the sum of the thickness of the first portion 51a and the thickness of the second portion 51b.

Figure 16:
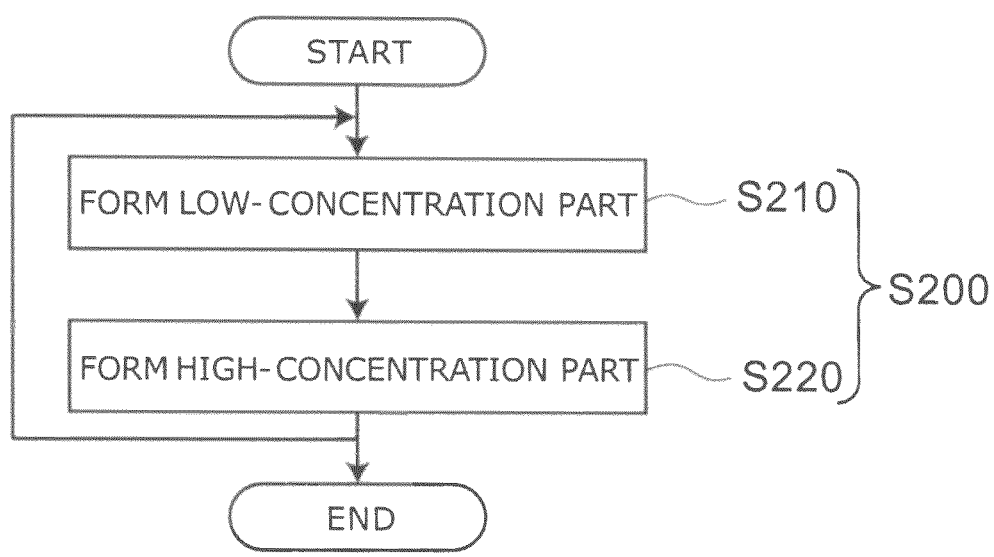
FIG. 16 is a flow chart showing another method for manufacturing the nitride semiconductor layer according to the third embodiment.

FIG. 16 is a flow chart illustrating another method for manufacturing the nitride semiconductor layer according to the third embodiment.

The manufacturing method includes a process of forming the functional layer 10s on the AlN buffer layer 55 formed on the silicon substrate 40 (Step S200). Forming the functional layer 10s repeats a process a plurality of times, the process including: forming a plurality of low-concentration parts 10l each including a nitride semiconductor and having a Si concentration less than $5 \times 10^{18}$ cm$^{-3}$ (step S210); and forming a plurality of high-concentration parts 10h having a Si concentration not less than $5 \times 10^{18}$ cm$^{-3}$ (step S220). The thickness of each of the plurality of high-concentration parts 10h is smaller than the thickness of each of the low-concentration parts 10l.

According to such manufacturing method, it is possible to manufacture the high-quality nitride semiconductor layer with the reduced number of cracks formed on the silicon substrate.

In the embodiment, for growth of the semiconductor layer, for example, a Metal-Organic Chemical Vapor Deposition (MOCVD), a Metal-Organic Vapor Phase Epitaxy (MOVPE), a Molecular Beam Epitaxy (MBE) and a Hydride Vapor Phase Epitaxy (HVPE) may be employed.

For example, in the case of employing the MOCVD or the MOVPE, in forming each semiconductor layer, following materials can be adopted. For example, TMGa (trimethyl gallium) and TEGa (triethyl gallium) can be used as a material for Ga. For example, TMIn (trimethyl indium) and TEIn (triethyl indium) can be used as a material for In. For example, TMAl (trimethyl aluminum) can be used as a material for Al. For example, $NH_3$ (ammonia), MMHy (monomethyl hydrazine) and DMHy (dimethyl hydrazine) can be used as a material for N. $SiH_4$ (monosilane) and $Si_2H_6$ (disilane) can be used as a material for Si.

According to the embodiment, it is possible to provide a method for manufacturing a high-quality nitride semiconductor device with the reduced number of cracks formed on the silicon substrate, a nitride semiconductor wafer and a nitride semiconductor layer.

In the specification, "nitride semiconductor" includes all compositions of semiconductors of the chemical formula $B_xIn_yAl_zGa_{1-x-y-z}N$ ($0 \leq x \leq 1$, $0 \leq y \leq 1$, $0 \leq z \leq 1$, and $x+y+z \leq 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to the specific examples. However, the invention is not limited to these specific examples. For example, one skilled in the art may similarly practice the invention by appropriately selecting specific configurations of component included in substrates included in nitride semiconductor devices and wafers, AlN buffer layers, intermediate layers, stacked foundation layers, AlN foundation layers, GaN foundation layers, functional layers, semiconductor layers and light emitting parts, etc., from known art. Such practice is included in the scope of the invention to the extent that similar effects thereto are obtained.

Moreover, all nitride semiconductor devices, nitride semiconductor wafers and methods for manufacturing nitride semiconductor layers practicable by an appropriate design modification by one skilled in the art based on the nitride semiconductor devices, nitride semiconductor wafers and methods for manufacturing nitride semiconductor layers described above as embodiments of the invention also are within the scope of the invention to the extent that the purport of the embodiments of the invention is included.

Furthermore, various modifications and alterations within the spirit of the invention will be readily apparent to those skilled in the art.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
a stacked foundation layer formed on an AlN buffer layer formed on a silicon substrate, the stacked foundation layer including a plurality of AlN foundation layers and a plurality of GaN foundation layers being alternately stacked with the AlN foundation layers; and
a functional layer including:
 a low-concentration part provided on the stacked foundation layer, the low-concentration part including a nitride semiconductor and having a Si concentration less than $1 \times 10^{18}$ cm$^{-3}$; and
 a high-concentration part provided on the low-concentration part and having a Si concentration not less than $1 \times 10^{18}$ cm$^{-3}$,
a substrate-side GaN foundation layer closest to the silicon substrate among the plurality of GaN foundation layers including:
a first portion having a Si concentration less than $5 \times 10^{18}$ cm$^{-3}$;
a second portion having a Si concentration less than $5 \times 10^{18}$ cm$^{-3}$; and
a third portion being provided between the first portion and the second portion, the third portion having a Si concentration not less than $5 \times 10^{18}$ cm$^{-3}$ and having a thickness smaller than a sum of a thickness of the first portion and a thickness of the second portion.

2. The device according to claim 1, wherein
the thickness of the third portion is not less than 0.1 nanometers and not more than 50 nanometers.

3. The device according to claim 1, wherein
all of the GaN foundation layers except for the substrate-side GaN foundation layer among the plurality of GaN foundation layers have a Si concentration less than $5 \times 10^{18}$ cm$^{-3}$.

4. The device according to claim 1, wherein
a thickness of the high-concentration part is not less than 1.5 micrometers and not more than 4 micrometers.

5. The device according to claim 1, wherein
the functional layer further includes:
a light emitting part provided on the high-concentration part and having a plurality of barrier layers and a plurality of well layers, the each of the well layers being provided between the barrier layers; and
a p-type semiconductor layer provided on the light emitting part, the p-type semiconductor layer including a nitride semiconductor and containing at least one of Mg, Zn and C.

6. A nitride semiconductor device comprising
a functional layer formed on an AlN buffer layer formed on a silicon substrate, the functional layer including:
a plurality of low-concentration parts including a nitride semiconductor and having a Si concentration less than $5 \times 10^{18}$ cm$^{-3}$; and
a plurality of high-concentration parts having a Si concentration not less than $5 \times 10^{18}$ cm$^{-3}$, the low-concentration parts being alternately stacked with the high-concentration parts,
a thickness of each of the high-concentration parts being smaller than a thickness of each of the low-concentration parts,
each of the high-concentration parts includes $Si_\alpha N_\beta$ ($0 < \alpha$, $0 < \beta$).

7. The device according to claim 6, wherein
the thickness of each of the high-concentration parts is not less than 0.1 nanometers and not more than 50 nanometers.

8. The device according to claim 6, further comprising
a stacked foundation layer formed on the AlN buffer layer and under the functional layer,
the stacked foundation layer including a plurality of AlN foundation layers and a plurality of GaN foundation layers being alternately stacked with the AlN foundation layers, and
a substrate-side GaN foundation layer closest to the silicon substrate among the plurality of GaN foundation layers including:
a first portion having a Si concentration less than $5 \times 10^{18}$ cm$^{-3}$;
a second portion having a Si concentration less than $5 \times 10^{18}$ cm$^{-3}$; and a third portion provided between the first portion and the second portion, the third portion having a Si concentration not less than $5\times10^{18}$ cm$^{-3}$ and having a thickness smaller than a sum of a thickness of the first portion and a thickness of the second portion.

9. A nitride semiconductor wafer comprising:
a silicon substrate;
an AlN buffer layer provided on the silicon substrate;
a stacked foundation layer provided on the AlN buffer layer, the stacked foundation layer including a plurality of AlN foundation layers and a plurality of GaN foundation layers being alternately stacked with the AlN foundation layers; and
a functional layer including
  a low-concentration part provided on the stacked foundation layer, the low-concentration part including a nitride semiconductor and having a Si concentration less than $5\times10^{18}$ cm$^{-3}$, and
  a high-concentration part provided on the low-concentration part and having a Si concentration not less than $5\times10^{18}$ cm$^{-3}$,
a substrate-side GaN foundation layer closest to the silicon substrate among the plurality of GaN foundation layers including:
a first portion having a Si concentration less than $5\times10^{18}$ cm$^{-3}$;
a second portion having a Si concentration less than $5\times10^{18}$ cm$^{-3}$; and
a third portion provided between the first portion and the second portion, the third portion having a Si concentration not less than $5\times10^{18}$ cm$^{-3}$ and having a thickness smaller than a sum of a thickness of the first portion and a thickness of the second portion.

10. The wafer according to claim 9, wherein
the thickness of the third portion is not less than 0.1 nanometers and not more than 50 nanometers.

11. The wafer according to claim 9, wherein
all of the GaN foundation layers except for the substrate-side GaN foundation layer among the plurality of GaN foundation layers have a Si concentration less than $5\times10^{18}$ cm$^{-3}$.

12. The wafer according to claim 9, wherein
a thickness of the high-concentration part is not less than 1.5 micrometers and not more than 4 micrometers.

13. The wafer according to claim 9, wherein
the functional layer further includes:
a light emitting part provided on the high-concentration part and having a plurality of barrier layers and a plurality of well layers, the each of the well layers being provided between the barrier layers; and
a p-type semiconductor layer provided on the light emitting part, the p-type semiconductor layer including a nitride semiconductor and containing at least one of Mg, Zn and C.

14. A nitride semiconductor wafer comprising:
a silicon substrate;
an AlN buffer layer provided on the silicon substrate; and
a functional layer provided on the AlN buffer layer,
the functional layer including:
  a plurality of low-concentration parts including a nitride semiconductor and having a Si concentration less than $5\times10^{18}$ cm$^{-3}$; and
  a plurality of high-concentration parts having a Si concentration not less than $5\times10^{18}$ cm$^{-3}$, the low-concentration parts being alternately stacked with the high-concentration parts, a thickness of each of the high-concentration parts is smaller than a thickness of each of the low-concentration parts,
each of the high-concentration parts includes $Si_\alpha N_\beta$ ($0<\alpha$, $0<\beta$).

15. The wafer according to claim 14, wherein
the thickness of each of the high-concentration parts is not less than 0.1 nanometers and not more than 50 nanometers.

16. The wafer according to claim 14, further comprising
a stacked foundation layer formed on the AlN buffer layer and under the functional layer,
the stacked foundation layer including a plurality of AlN foundation layers and a plurality of GaN foundation layers being alternately stacked with the AlN foundation layers, and
a substrate-side GaN foundation layer closest to the silicon substrate among the plurality of GaN foundation layers including:
a first portion having a Si concentration less than $5\times10^{18}$ cm$^{-3}$;
a second portion having a Si concentration less than $5\times10^{18}$ cm$^{-3}$;and
a third portion provided between the first portion and the second portion, the third portion having a Si concentration not less than $5\times10^{18}$ cm$^{-3}$ and having a thickness smaller than a sum of a thickness of the first portion and a thickness of the second portion.

17. A method for manufacturing a nitride semiconductor layer comprising:
forming a stacked foundation layer by alternately stacking a plurality of AlN foundation layers and a plurality of GaN foundation layers on an AlN buffer layer provided on a silicon substrate; and
forming a functional layer by forming a low-concentration part on the stacked foundation layer and forming a high-concentration part on the low-concentration part, the low-concentration part including a nitride semiconductor and having a Si concentration less than $5\times10^{18}$ cm$^{-3}$, the high-concentration part having a Si concentration not less than $5\times10^{18}$ cm$^{-3}$,
in formation of a substrate-side GaN foundation layer closest to the silicon substrate among the plurality of GaN foundation layers, the forming the stacked foundation layer includes forming
a first portion having a Si concentration less than $5\times10^{18}$ cm$^{-3}$,
a second portion having a Si concentration less than $5\times10^{18}$ cm$^{-3}$ and
a third portion provided between the first portion and the second portion, the third portion having a Si concentration not less than $5\times10^{18}$ cm$^{-3}$ and having a thickness smaller than a sum of a thickness of the first portion and a thickness of the second portion.

18. The method according to claim 17, wherein
the thickness of the third portion is not less than 0.1 nanometers and not more than 50 nanometers.

19. A method for manufacturing a nitride semiconductor layer comprising:
forming a functional layer on an AlN buffer layer formed on a silicon substrate,
the forming the functional layer including repeating a process a plurality of times, the process including:
forming a low-concentration part including a nitride semiconductor and having a Si concentration less than $5\times10^{18}$ cm$^{-3}$; and forming a high-concentration part having a Si concentration not less than $5 \times 10^{18}$ cm$^{-3}$, and a thickness of each of the high-concentration parts is smaller than a thickness of each of the low-concentration parts, each of the high-concentration parts includes $Si_\alpha N_\beta (0<\alpha, 0<\beta)$.

20. The method according to claim 19, wherein the thickness of each of the high-concentration parts is not less than 0.1 nanometers and not more than 50 nanometers.

21. The device according to claim 1, wherein the third portion includes $Si_\alpha N_\beta (0<\alpha, 0<\beta)$.

22. The wafer according to claim 9, wherein the third portion includes $Si_\alpha N_\beta (0<\alpha, 0<\beta)$.

23. The wafer according to claim 17, wherein the third portion includes $Si_\alpha N_\beta (0<\alpha, 0<\beta)$.

24. The device according to claim 6, wherein the thickness of each of the low-concentration parts is not less than 50 nanometers and not more than 500 nanometers.

25. The device according to claim 6, wherein the thickness of each of the low-concentration parts is not less than 300 nanometers and not more than 500 nanometers.

26. The wafer according to claim 14, wherein the thickness of each of the low-concentration parts is not less than 50 nanometers and not more than 500 nanometers.

27. The wafer according to claim 14, wherein the thickness of each of the low-concentration parts is not less than 300 nanometers and not more than 500 nanometers.

28. The method according to claim 19, wherein the thickness of each of the low-concentration parts is not less than 50 nanometers and not more than 500 nanometers.

29. The method according to claim 19, wherein the thickness of each of the low-concentration parts is not less than 300 nanometers and not more than 500 nanometers.

* * * * *